United States Patent
Chuang et al.

(10) Patent No.: US 9,590,059 B2
(45) Date of Patent: Mar. 7, 2017

(54) INTERDIGITATED CAPACITOR TO INTEGRATE WITH FLASH MEMORY

(71) Applicant: Taiwan Semiconductor Manufacturing Co., Ltd., Hsin-Chu (TW)

(72) Inventors: Harry-Hak-Lay Chuang, Zhubei (TW); Yu-Hsiung Wang, Zhubei (TW); Chen-Chin Liu, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 14/851,284

(22) Filed: Sep. 11, 2015

(65) Prior Publication Data

US 2016/0190143 A1 Jun. 30, 2016

Related U.S. Application Data

(60) Provisional application No. 62/096,616, filed on Dec. 24, 2014.

(51) Int. Cl.
*H01L 29/41* (2006.01)
*H01L 29/423* (2006.01)
(Continued)

(52) U.S. Cl.
CPC .... *H01L 29/42344* (2013.01); *H01L 27/0629* (2013.01); *H01L 27/11573* (2013.01); *H01L 28/90* (2013.01); *H01L 29/408* (2013.01)

(58) Field of Classification Search
CPC ......... H01L 27/10805; H01L 27/10847; H01L 28/40; H01L 28/42; H01L 28/86; H01L 29/41758; H01L 2924/19041; H01L 29/21
See application file for complete search history.

(56) References Cited

U.S. PATENT DOCUMENTS 6,228,695 B1 * 5/2001 Hsieh ................ H01L 21/28273
257/E21.209
6,528,842 B1 * 3/2003 Luich .................. H01L 29/7883
257/314
(Continued)

OTHER PUBLICATIONS

Ng, et al., A study of the influence of tunnel oxide thickness on the performance of flash memory based on ion-beam synthesized silicon nanocrystals, phys. stat. sol. (a) 203, No. 6, 2006, pp. 1291-1295.*

(Continued)

*Primary Examiner* — Earl Taylor
(74) *Attorney, Agent, or Firm* — Eschweiler & Associates, LLC

(57) ABSTRACT

Some embodiments relate to an integrated circuit (IC). The IC includes a semiconductor substrate including a flash memory region and a capacitor region. A flash memory cell is arranged over the flash memory region and includes a polysilicon select gate arranged between first and second source/drain regions of the flash memory cell. The flash memory cell also includes a control gate arranged alongside the select gate and separated from the select gate by a control gate dielectric layer. A capacitor is arranged over the capacitor region and includes: a polysilicon first capacitor plate and polysilicon second capacitor plate, which are interdigitated with one another and separated from one another by a capacitor dielectric layer. The capacitor dielectric layer and control gate dielectric layer are made of the same material.

20 Claims, 10 Drawing Sheets

(51) Int. Cl.
*H01L 29/40* (2006.01)
*H01L 27/06* (2006.01)
*H01L 27/115* (2006.01)
*H01L 49/02* (2006.01)

(56) References Cited

U.S. PATENT DOCUMENTS

| | | | | | |
|---|---|---|---|---|---|
| 6,806,529 | B1* | 10/2004 | Hopper | | H01L 21/28273 257/314 |
| 6,956,261 | B2* | 10/2005 | Shibata | | H01L 27/10894 257/303 |
| 7,186,625 | B2* | 3/2007 | Chudzik | | H01L 23/5223 257/E21.016 |
| 7,245,531 | B2* | 7/2007 | Okazaki | | G11C 16/0425 257/316 |
| 7,471,570 | B2* | 12/2008 | Morton | | G11C 16/0416 365/185.14 |
| 7,968,924 | B2* | 6/2011 | Sato | | H01L 27/105 257/296 |
| 8,138,537 | B2* | 3/2012 | Sato | | H01L 27/105 257/296 |
| 8,243,510 | B2* | 8/2012 | Chen | | H01L 29/7881 257/315 |
| 8,373,216 | B2* | 2/2013 | Chakihara | | H01L 21/28273 257/298 |
| 8,461,630 | B2* | 6/2013 | Endo | | H01L 27/1288 257/217 |
| 8,749,022 | B2* | 6/2014 | Chang | | H01L 23/5223 257/532 |
| 8,896,053 | B2* | 11/2014 | Chakihara | | H01L 21/28273 257/314 |
| 8,951,864 | B2* | 2/2015 | Wang | | H01L 21/28273 257/624 |
| 2006/0035435 | A1* | 2/2006 | Yasui | | H01L 27/115 438/299 |
| 2007/0064494 | A1* | 3/2007 | Morton | | G11C 16/0416 365/185.28 |
| 2007/0249166 | A1* | 10/2007 | Pelella | | H01L 21/84 438/689 |
| 2007/0269972 | A1* | 11/2007 | Kawashima | | H01L 21/28282 438/597 |
| 2008/0124866 | A1* | 5/2008 | Eun | | H01L 27/115 438/264 |
| 2009/0090948 | A1* | 4/2009 | Sato | | H01L 27/105 257/296 |
| 2009/0101961 | A1* | 4/2009 | He | | H01L 29/42328 257/319 |
| 2009/0184359 | A1* | 7/2009 | He | | H01L 21/28282 257/316 |
| 2010/0289120 | A1* | 11/2010 | Sato | | H01L 27/105 257/534 |
| 2011/0095348 | A1* | 4/2011 | Chakihara | | H01L 21/28273 257/298 |
| 2011/0242888 | A1* | 10/2011 | Arigane | | G11C 16/0466 365/184 |
| 2012/0112256 | A1* | 5/2012 | Tan | | H01L 29/42328 257/296 |
| 2012/0138921 | A1* | 6/2012 | Endo | | H01L 27/1288 257/43 |
| 2013/0084697 | A1* | 4/2013 | Shen | | H01L 21/28273 438/591 |
| 2013/0126960 | A1* | 5/2013 | Chakihara | | H01L 21/28273 257/324 |
| 2013/0181273 | A1* | 7/2013 | Charpin-Nicolle | | H01L 21/28273 257/314 |
| 2013/0187213 | A1* | 7/2013 | Charpin-Nicolle | | H01L 21/28282 257/314 |
| 2013/0240977 | A1* | 9/2013 | Kaneoka | | H01L 29/66833 257/325 |
| 2014/0357072 | A1* | 12/2014 | Shen | | H01L 21/28273 438/591 |
| 2015/0054045 | A1* | 2/2015 | Chakihara | | H01L 21/28273 257/314 |
| 2015/0279849 | A1* | 10/2015 | Chang | | H01L 29/42328 257/319 |
| 2016/0020219 | A1* | 1/2016 | Chuang | | H01L 27/11573 257/324 |
| 2016/0049420 | A1* | 2/2016 | Chang | | H01L 29/6656 257/325 |
| 2016/0163720 | A1* | 6/2016 | Abe | | H01L 27/11206 257/306 |

OTHER PUBLICATIONS

Punchaipetch, et al., Effect of SiO2 Tunnel Oxide Thickness on Electron Tunneling Mechanism in Si Nanocrystal Dots Floating-Gate Memories, Japanese Journal of Applied Physics, vol. 45, No. 5A, 2006, pp. 3997-3999.*

Ioannou-Sougleridis, et al., Oxide-nitride-oxide dielectric stacks with Si nanoparticles obtained by low-energy ion beam synthesis, Nanotechnology, No. 18, 2007, pp. 1-7.*

* cited by examiner

INTERDIGITATED CAPACITOR TO INTEGRATE WITH FLASH MEMORY

The present application claims priority to U.S. provisional application filed on Dec. 24, 2014, which has an Application No. 62/096,616 and is entitled "INTERDIGITATED CAPACITOR TO INTEGRATE WITH FLASH MEMORY", the contents of which are incorporated herein in their entirety.

BACKGROUND

A trend in the semiconductor manufacturing industry is to integrate different circuit elements, including logic, memory, processors, peripherals, etc., on a common semiconductor substrate. Such integration can lower manufacturing costs, simplify manufacturing procedures, and increase operational speed of the resultant circuit compared to approaches where the circuit elements are made on separate ICs and then electrically coupled to one another on a printed circuit board. One type of integrated device is an embedded flash memory device. An embedded flash memory device can include an array of flash memory cells and logic circuits that support operation of the flash memory cells, and can optionally include processors, peripherals, and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
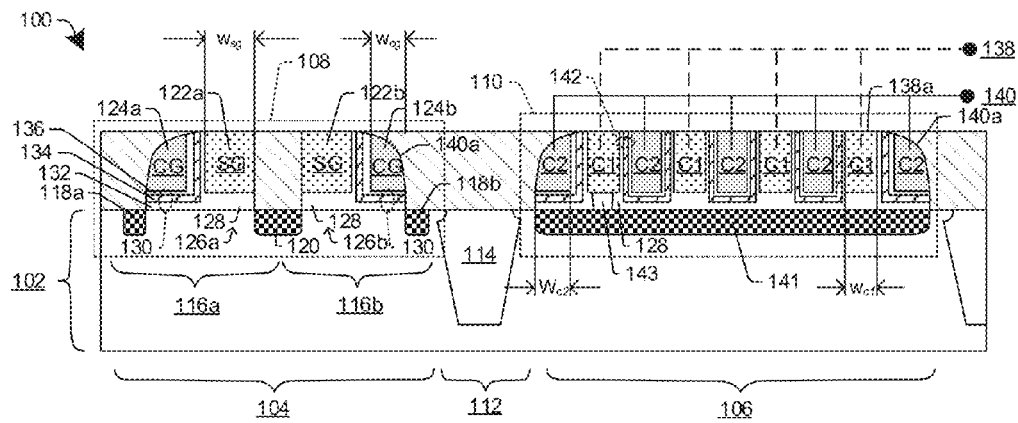
FIG. 1 illustrates a cross-sectional view of a flash memory device in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a cross-sectional view of some embodiments of an integrated circuit (IC) 100 in accordance with some embodiments. The IC 100 includes a semiconductor substrate 102, which includes a flash memory region 104 and a capacitor region 106. A flash memory device 108 is arranged over the flash memory region 104 and a capacitor 110 is arranged over the capacitor region 106. In some instances, the flash memory region 104 and capacitor region 106 are spaced apart by a shallow trench isolation (STI) region 112, which includes an isolation structure 114 such as a dielectric or doped region that fills a trench in the substrate 102.

The flash memory device 108 is illustrated as a pair of split gate flash memory cells, which includes first and second flash memory cells 116a, 116b that store separate data states. The first and second flash memory cells 116a, 116b include first and second individual source/drain regions 118a, 118b, respectively, and a common source/drain region 120 which is shared between the first and second memory cells. The first and second flash memory cells 116a, 116b also include first and second select gates (SG) 122a, 122b, respectively, and first and second control gates (CG) 124a, 124b, respectively. The first select gate 122a and first control gate 124a are arranged over a first channel region 126a, which separates the first individual source/drain region 118a and the common source/drain region 120. The second select gate 122b and second control gate 124b are arranged over a second channel region 126b, which separates the second individual source/drain region 118b and the common source/drain region 120. A gate dielectric 128, such as silicon dioxide or a high-x dielectric material, is arranged under the first and second select gates 122a, 122b, and separates the first and second select gates from the substrate 102. A control gate dielectric 130 separates the first and second control gates 124a, 124b from the substrate 102. The control gate dielectric 130 also extends vertically upwards between neighboring sidewalls of the first select gate 122a and first control gate 124b, and between neighboring sidewalls of the second select gate 122b and second control gate 124b.

The capacitor 110 is arranged over the capacitor region 106 and includes a first polysilicon capacitor plate (C1) 138 and second polysilicon capacitor plate (C2) 140. Gate dielectric 128 extends under the first capacitor plate 138, and a capacitor dielectric 142, which includes the same material and the same structure as the control gate dielectric 130, separates neighboring sidewalls of the first and second capacitor plates 138, 140 from one another. For example, in some embodiments, the capacitor dielectric layer 142 and control gate dielectric layer 130 each comprise a tunnel dielectric layer 132, a capping dielectric layer 136, and a charge-trapping layer 134 sandwiched between the tunnel and capping dielectric layers 132, 136. In some embodiments, the tunnel dielectric layer 132 is a $SiO_2$ layer, the charge-trapping layer 134 is a layer of silicon dots, and capping dielectric layer 136 is an $SiO_2$ layer; while in other embodiments the tunnel dielectric layer 132 is an $SiO_2$ layer, the charge-trapping layer 134 is a nitride layer, and the capping dielectric layer 136 is an $SiO_2$ layer.

As will be appreciated in more detail below, the first and second capacitor plates 138, 140 are inter-digitated with one another to provide for a streamlined capacitive element which can have an increased capacitance relative to conventional approaches. In some embodiments, the first capacitor plate 138 is formed concurrently with the first and second select gates 122a, 122b, and each of these are made of a first polysilicon material, such as a polysilicon 1 layer. Further, the second capacitor plate 140 can be formed concurrently with the first and second control gates 124a, 124b (and at a different time than the first capacitor plate 138 and the first and second select gates 122a, 122b), and each of these are made of a second polysilicon material, such as a polysilicon 2 layer. Depending on the implementation, the first and second polysilicon materials can be have the same lattice structure, the same doping concentrations, the same conductivities, and the same electrical and physical characteristics as one another even though they are formed at different times. However, in other embodiments, the first and second polysilicon materials can formed by different processes and have different lattice structures, different doping concentrations, different conductivities, and/or different physical or electrical characteristics from one another.

Further, in some embodiments, a doped capacitor region 141, which has a doping type that is opposite of the surrounding substrate 102, is arranged in the substrate 102 and is ohmically coupled to the first capacitor plate 138 (or the second capacitor plate 140) through one or more contacts (e.g., contact 143), such that the doped capacitor region 141 and the polysilicon first capacitor plate 138 (or the doped capacitor region 141 and the second capacitor plate 140) collectively act as a single capacitor plate. This doped capacitor region 141 is optional and can increase the capacitance between the first and second capacitor plates 138, 140, but is not present in all embodiments.

Further still, in some embodiments, the first capacitor plate 138 has an upper surface 138a and/or a thickness corresponding to that of the first or second select gate 122a, 122b. For example, upper surface 138a of the first capacitor plate 138 and upper surface of the first and second select gates 122a, 122b can be co-planar, although the respective widths, $w_{c1}$, $w_{sg}$, can be the same or different. The second capacitor plate 140 can have an upper surface and/or thickness corresponding to that of the first or second control gate 124a, 124b. For example, the outermost portion of the second capacitor plate 140 and first or second control gate 124a, 124b can have upper outermost edges 140a that are rounded and can have respective widths $w_{c2}$, $w_{cg}$ that are equal.

FIGS. 2-5 show several top views of embodiments of different capacitor regions (e.g., capacitor region 106 of FIG. 1), which have first and second capacitor plates 138, 140, which are inter-digitated with one another. In these examples, the capacitor dielectric layer 142 is made of the same material and has the same structural features as the control gate dielectric layer 130.

Figures 2, 3:
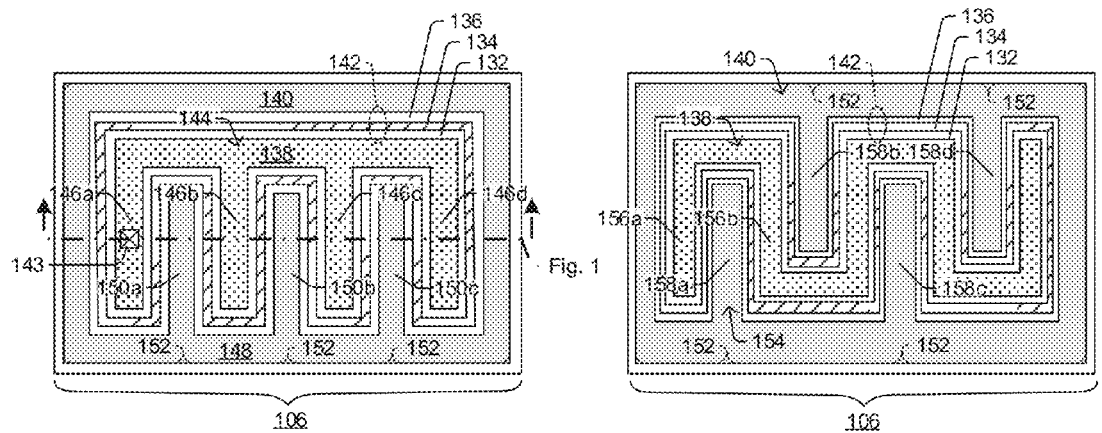
FIGS. 2-5 illustrate top views of several flash memory devices in accordance with some embodiments.

FIG. 2, for example, depicts first and second capacitor plates 138, 140 which are inter-digitated with one another and separated from one another by a capacitor dielectric layer 142. In FIG. 2, the illustrated first capacitor plate 138 includes a first trunk 144 with four fingers 146a-146d that branch off from the different locations on the first trunk 144, and the illustrated second capacitor plate 140 includes a second trunk 148 with three fingers 150a-150c that are inter-digitated with the fingers 146a-146d. The capacitor dielectric 142 conformally and laterally surrounds the first capacitor plate 138 and separates the first and second capacitor plates 138, 140 from one another.

In some implementations, the second capacitor plate 140 is formed by a conformal process that leaves an outer perimeter of the second capacitor plate with small divots or seams 152 corresponding to recesses in the sidewalls of the first capacitor plate 138 (i.e., the outer perimeter is not necessarily smooth or truly rectangular and in some instances may not have sharp corners of 90-degrees). Thus, these divots or seams 152 evidence the second capacitor plate 140 was formed conformally about the first capacitor plate 138. Thus, some examples of seams or divots 152 are shown by dashed lines in FIGS. 2-5 for illustrative purposes.

FIG. 3 depicts another example top view where a first capacitor plate 138 has a winding or serpentine shape that changes its direction without including any branch points thereon. Because of this winding shape, the first capacitor plate 138 includes sidewall recesses 154 between neighboring segments (e.g., 156a, 156b) within the length of the first capacitor plate 138. The capacitor dielectric 142 conformally surrounds the first capacitor plate 138 and separates the first and second capacitor plates 138, 140 from one another. The second capacitor plate 140 laterally surrounds the first capacitor plate 138, and includes fingers, which extend into the respective sidewall recesses to provide for inter-digitation. For example, in the illustrated embodiment, the second capacitor plate includes four fingers 158a-158d that are inter-digitated with regards to the first capacitor plate 138.

Figure 4:
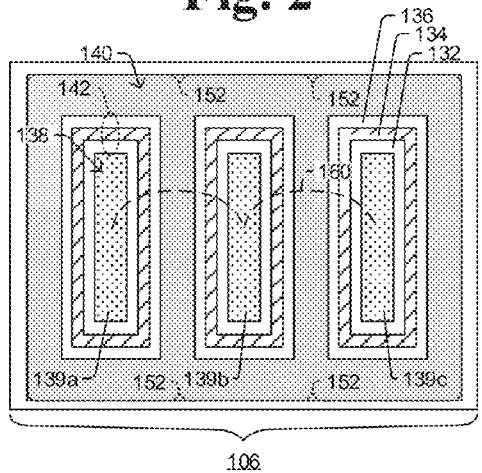

FIG. 4 shows another example where the first capacitor plate 138 is a series of discrete segments or islands 139a-139c, which are conformally surrounded by the capacitor dielectric 142, which is in turn conformally surrounded by the second capacitor plate 140. In this example, the islands of the first capacitor plate can be electrically coupled to one another (see line 160), for example by contacts extending downwardly from a metal line to each of the respective islands, or by being coupled to a conductive body, such as a metal or polysilicon line or a highly doped substrate region, buried in the semiconductor substrate.

Figure 5:
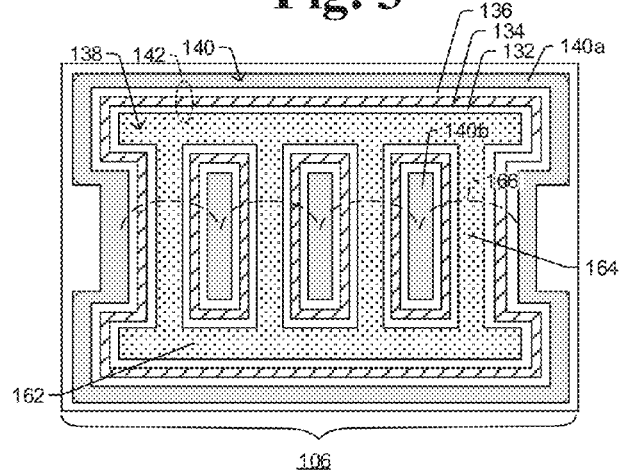

FIG. 5 shows another example where the first capacitor plate 138 is a ladder-like structure of legs (e.g., 162) and rungs (e.g., 164), and is conformally surrounded by the capacitor dielectric 142, which is in turn surrounded by an outer portion (140a) of the second capacitor plate 140 and which also surrounds inner island portions (140b) of the second capacitor plate 140. In this example, the islands 140b of the second capacitor plate can be electrically coupled to one another (see line 166), for example by contacts extending downwardly from a metal line to each of the respective islands, or by a being coupled to a conductive body, such as a metal or polysilicon line or a highly doped substrate region, buried in the semiconductor substrate.

Figure 6:
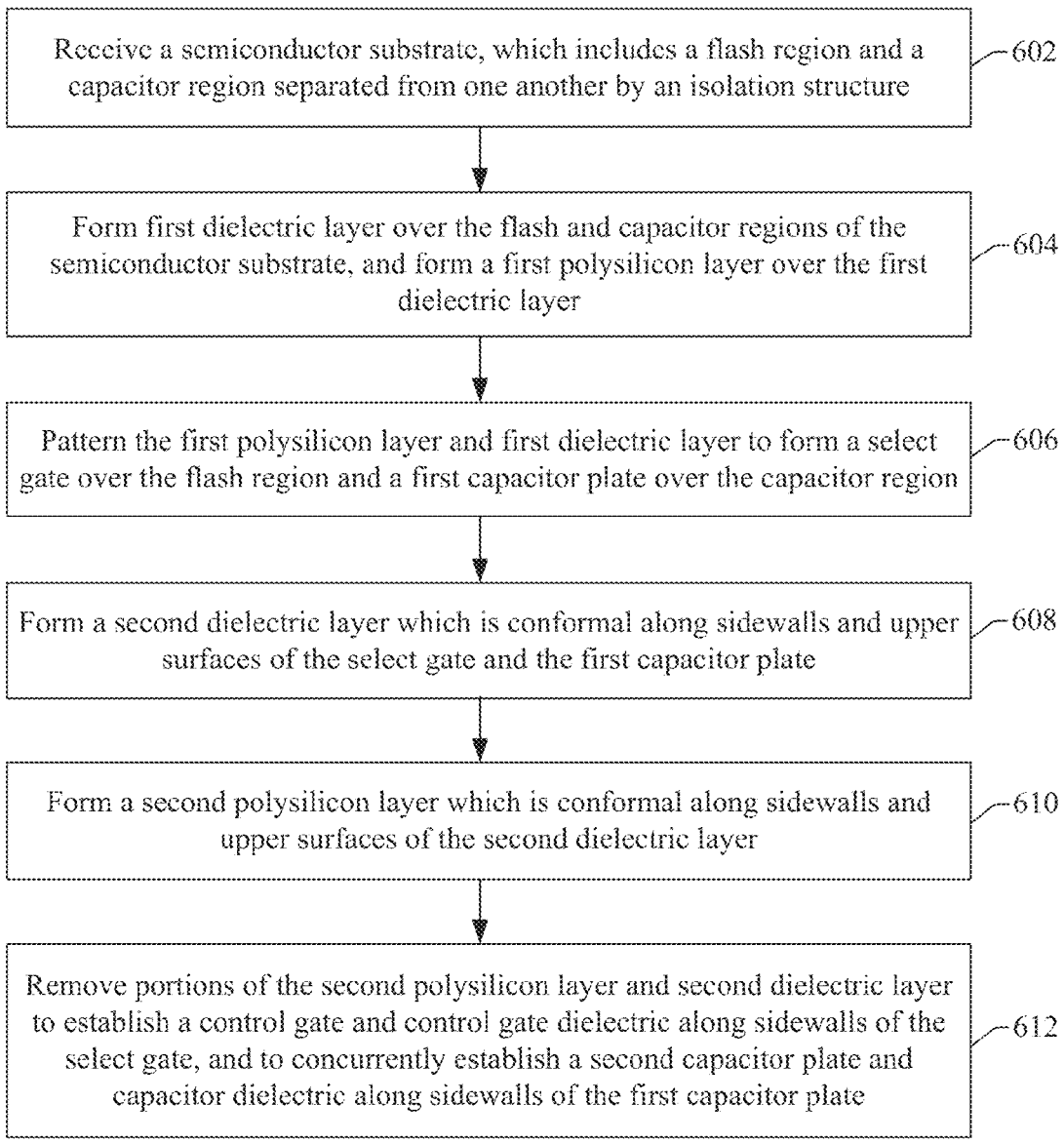
FIG. 6 depicts a method of forming a flash memory device in flow chart format in accordance with some embodiments.

FIG. 6 illustrates some embodiments of a methodology of forming a semiconductor device, such as a wafer which includes a plurality of integrated circuits or die thereon. While the disclosed methods (e.g., the method described by the flowchart 600 and other methods disclosed herein) may be illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In 602, a semiconductor substrate, which includes a flash region and a capacitor region, is received. In some embodiments, the substrate also includes an NMOS logic region and a PMOS logic region, and STI regions can separate each of these regions from one another.

In 604, a first dielectric layer is formed over the flash and capacitor regions of the semiconductor substrate, and a first polysilicon layer is formed over the first dielectric layer.

In 606, some portions of the first polysilicon layer and first dielectric layer are removed so that remaining portions of the first polysilicon layer and first dielectric layer concurrently establish a select gate over the flash region and a first capacitor plate over the capacitor region.

In 608, a second dielectric layer which is conformal is formed along sidewalls and upper surfaces of the select gate and the first capacitor plate.

In 610, a second polysilicon layer which is conformal is formed along sidewalls and upper surfaces of the second dielectric layer.

In 612, portions of the second polysilicon layer and second dielectric layer are removed to concurrently establish a control gate and control gate dielectric over the flash region and a second capacitor plate and capacitor dielectric over the capacitor region. The second capacitor plate is inter-digitated with the first capacitor plate, and the second dielectric layer separates the first and second capacitor plates to act as a capacitor dielectric and also separates the control gate and select gate to act as a control dielectric.

With reference to FIGS. 7 through 17, cross-sectional views of some embodiments of a semiconductor structure having an integrated circuit having flash memory and an integrated capacitor at various stages of manufacture are provided to illustrate an example of the method of FIG. 6. Although FIGS. 7 through 17 are described in relation to the method, it will be appreciated that the structures disclosed in FIGS. 7 through 17 are not limited to the method, but instead may stand alone as structures independent of the method. Similarly, although the method is described in relation to FIGS. 7 through 17, it will be appreciated that the method is not limited to the structures disclosed in FIGS. 7 through 17, but instead may stand alone independent of the structures disclosed in FIGS. 7 through 17.

Figure 7:
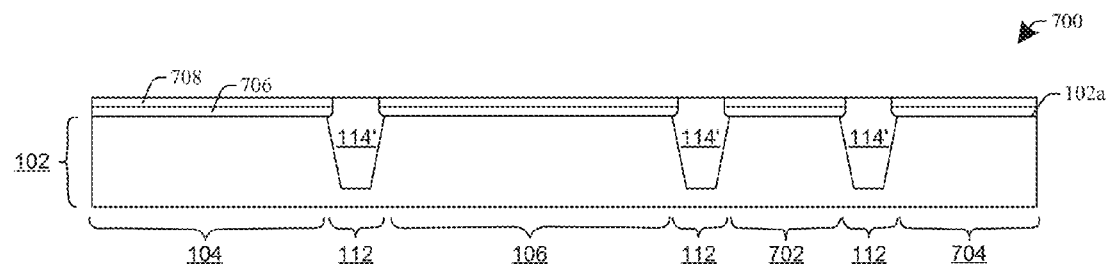
FIGS. 7-19 illustrate a series of cross-sectional views that collectively illustrate a method of forming a flash memory device in accordance with some embodiments.

FIG. 7 illustrates a cross-sectional view 700 of some embodiments corresponding to Act 602 of FIG. 6.

In FIG. 7, a semiconductor substrate 102 is received. The substrate 102 includes a flash memory region 104, a capacitor region 106, an NMOS logic region 702, and a PMOS logic region 704. In some embodiments, STI regions 112, which can include respective STI precursor structures 114', can separate each of these regions from one another. In some embodiments, the semiconductor substrate 102 can be a bulk silicon substrate or a semiconductor-on-insulator (SOI) substrate (e.g., silicon on insulator substrate). The semiconductor substrate 102 can also be a binary semiconductor substrate (e.g., GaAs), a tertiary semiconductor substrate (e.g., AlGaAs), or a higher order semiconductor substrate, for example. The substrate 102 can include doped regions formed in the substrate, epitaxial layers formed on the substrate, one or more insulating layers formed in or on the substrate, and/or conducting layers formed in or on the substrate. In many instances, the semiconductor substrate 102 manifests as a semiconductor wafer during the manufacturing process, and can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); 450 mm (17.7 inch, usually referred to as "18 inch"); for example. After processing is completed, for example after flash memory devices, capacitor elements, and logic elements are formed, such a wafer can optionally be stacked with other wafers or die, and is then singulated into individual die which correspond to individual ICs.

In FIG. 7, a first mask 706 and a second mask 708 have been formed over an upper substrate surface 102a of the semiconductor substrate 102, and a first etch has been performed with the first and/or second masks 706, 708 in place to form a series of trenches surrounding the respective regions 104, 106, 702, 704. The first mask 706 can be a hardmask layer, such as a nitride, and the second mask 708 can be a photoresist layer, for example. After the trenches have been formed, the trenches can be filled with an isolation material, such as a dielectric material, to form STI precursor structures 114'.

Figure 8:
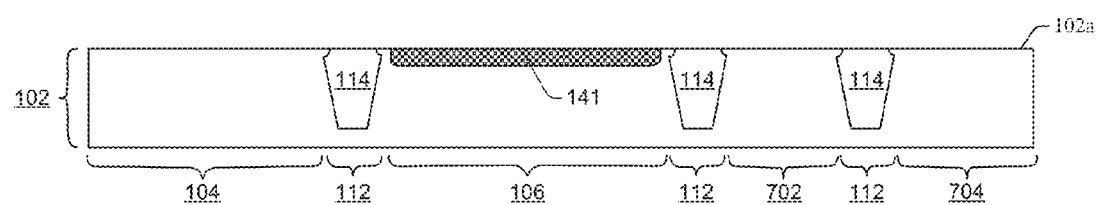

In FIG. 8, the STI precursor structures 114' are chemically mechanically polished (i.e., CMPed) to form isolation structures 114 around and between the respective regions 104, 106, 702, 704. The first and second masks 706, 708 can be removed via this CMP process, or can be removed prior to this CMP process. Also in FIG. 8, a doped capacitor region 141 has been formed, for example by implanting ions through openings in a third mask (not shown). The doped capacitor region 141 can have a doping type that is opposite that of the substrate 102. For example, if the substrate 102 is an n-type substrate, the doped capacitor region 141 can be p-type. Because the doped capacitor region 141 can provide an increased capacitance compared to implementations where it is not present, the remaining cross-sectional views in FIG. 9-17 depict this doped capacitor region 141 as being present. However, in other embodiments, this doped capacitor region 141 can be omitted to reduce processing time and costs.

Figure 9:
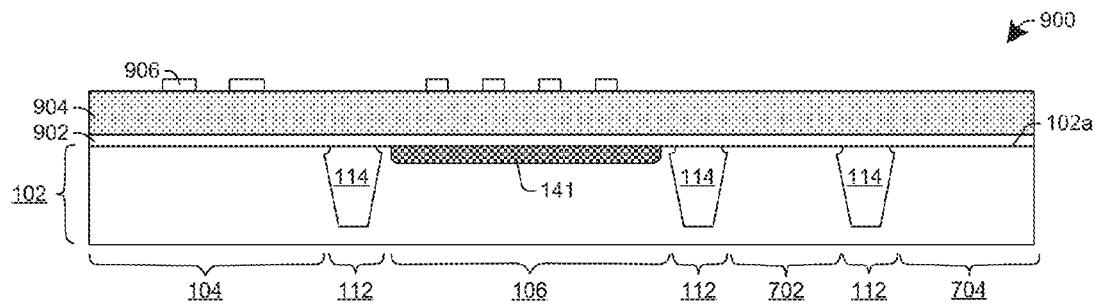

FIG. 9 illustrates a cross-sectional view 900 of some embodiments corresponding to Act 604 of FIG. 6.

In FIG. 9, a first dielectric layer 902 is provided over the upper substrate surface 102a, and a first doped polysilicon layer 904 is formed over the first dielectric layer 902. In some embodiments, the first dielectric layer 902 can be a silicon dioxide ($SiO_2$) layer having a dielectric constant of approximately 3.9, but in other embodiments the first dielectric layer 902 can be a high-κ dielectric layer having a dielectric constant of greater than 3.9, such as hafnium silicate, zirconium silicate, hafnium dioxide or zirconium dioxide, for example. After the first dielectric layer 902 and first doped polysilicon layer 904 are formed, a fourth mask 906, such as a photoresist mask, is patterned over the first doped polysilicon layer 904.

Figure 10A:
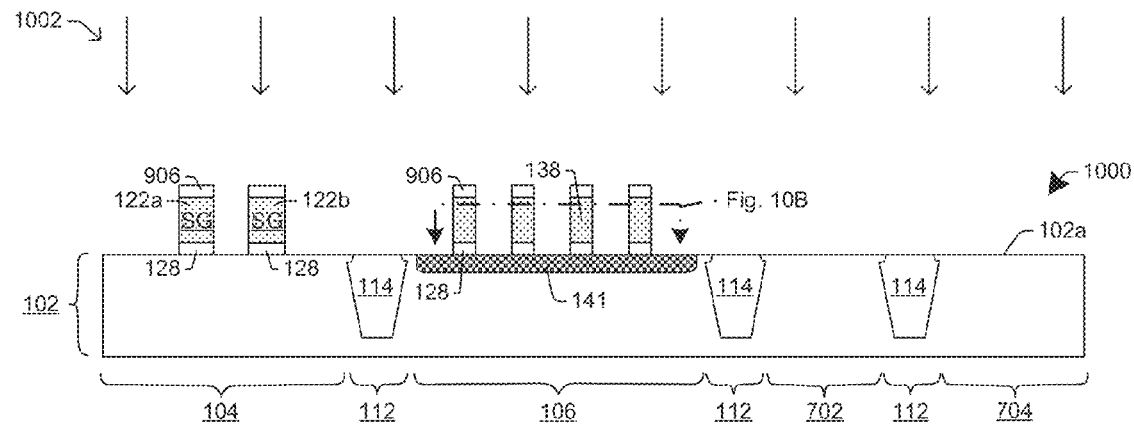

FIG. 10A illustrates a cross-sectional view 1000 of some embodiments corresponding to Act 606 of FIG. 6.

Figure 10B:
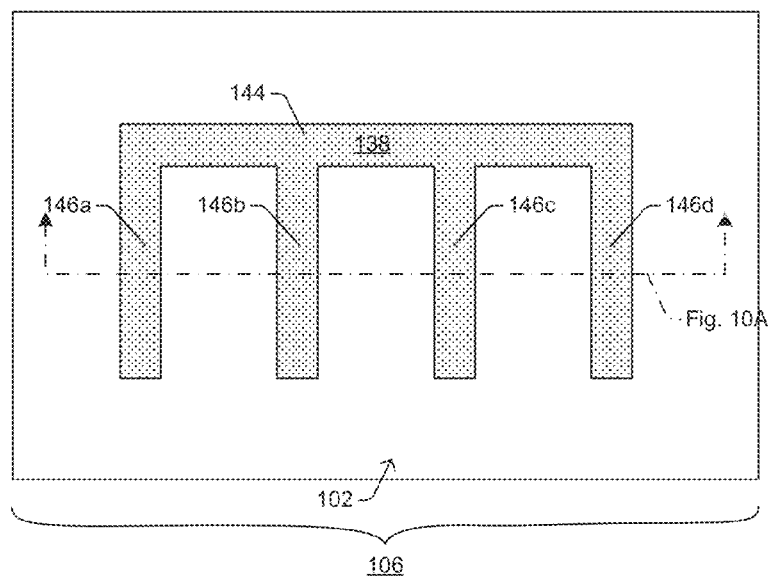

In FIG. 10A, with fourth mask 906 in place, an etch 1002 is carried out to remove portions of the first doped polysilicon layer 904 and first dielectric layer 902, such that the remaining portions of the first doped polysilicon and dielectric layers establish polysilicon select gates 122a, 122b and a polysilicon first capacitor plate 138. The remaining gate dielectric 128 separates the select gates 122a, 122b and first capacitor plate 138 from the substrate 102. As shown in FIG. 10B, which shows a top view of the capacitor region 106 in accordance with some embodiments of FIG. 10A, the first capacitor plate 138 can include a first trunk 144 with a first plurality of fingers 146a-146d branching off from the first trunk 144 in some embodiments. Note that for purposes of simplicity, the capacitor region 141 and isolation structure 114 are not explicitly illustrated in the top view of FIG. 10B.

Figure 11A:
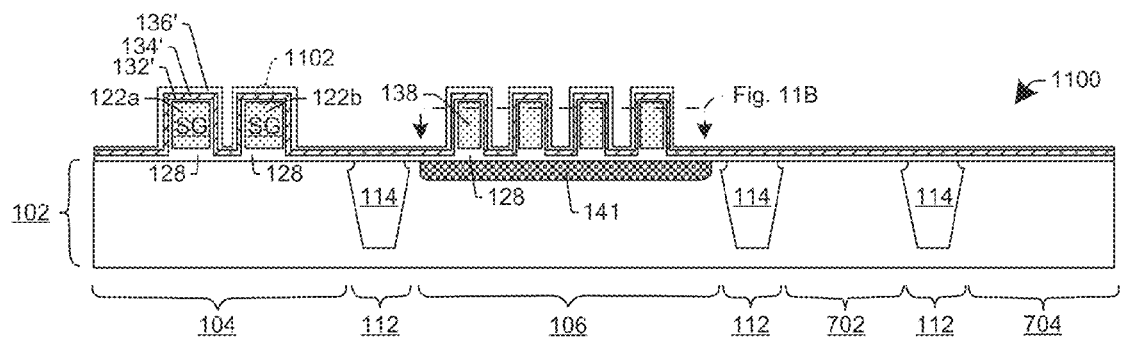

FIG. 11A illustrates a cross-sectional view 1100 of some embodiments corresponding to Act 608 of FIG. 6.

Figure 11B:
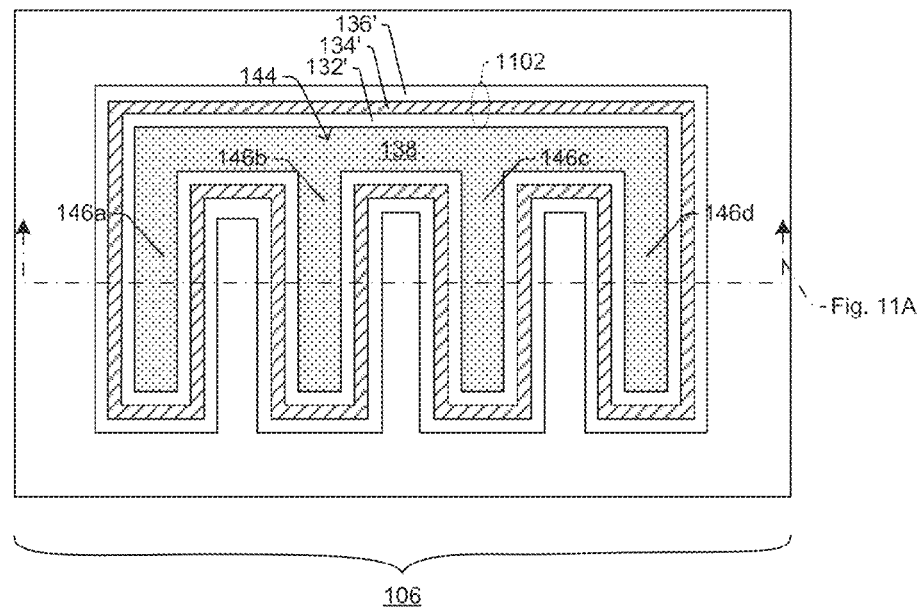

In FIG. 11A, a second dielectric layer 1102 is formed along sidewalls of the first and second select gates 122a, 122b, over top surfaces of the first and second select gates 122a, 122b, and over sidewalls and top surfaces of the first capacitor plate 138. In the illustrated embodiments, the second dielectric layer 1102 includes three sublayers, namely a tunnel dielectric layer 132', a charge trapping layer 134', and a capping dielectric layer 136'. The tunnel dielectric layer 132' is formed over the upper substrate surface 102a, and extends conformally along sidewalls and upper surfaces of the first and second select gates 122a, 122b, and over sidewalls and top surfaces of the first capacitor plate 138. The charge-trapping layer 134' is then formed over the tunnel dielectric layer 132' and extends conformally over upper surfaces and sidewalls thereof. The capping dielectric layer 136' is then formed over the charge-trapping layer 134' and extends conformally over upper surfaces and sidewalls thereof. In some embodiments, the tunnel dielectric layer 132' is a $SiO_2$ layer, the charge-trapping layer 134' is a layer of silicon dots, and capping dielectric layer 136' is an $SiO_2$ layer; while in other embodiments the tunnel dielectric layer 132' is an $SiO_2$ layer, the charge-trapping layer 134' is a nitride layer, and the capping dielectric layer 136' is an $SiO_2$ layer. As shown in FIG. 11B, which shows a top view of the capacitor region 106 in accordance with some embodiments of FIG. 11A, the second dielectric layer 1102 laterally surrounds the first capacitor plate 138 and will later act as a capacitor dielectric to separate the first capacitor plate 138 from a second capacitor plate. The second dielectric layer 1102 also laterally surrounds the first and second select gates 122a, 122b and will later act as a control gate dielectric for a pair of flash memory cells.

Figure 12A:
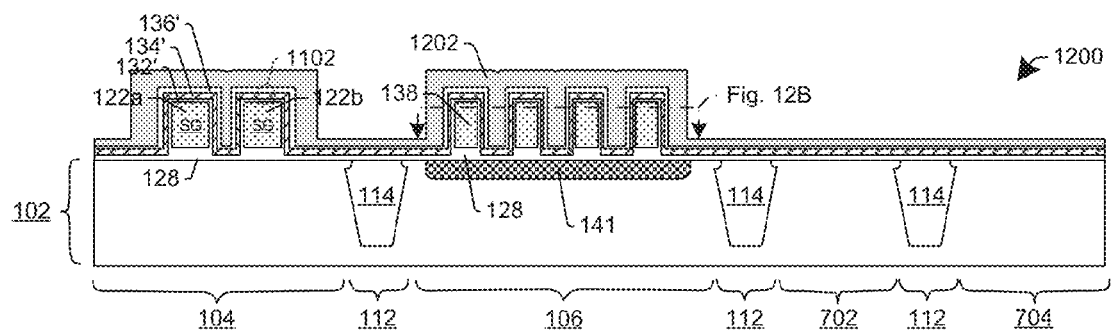

FIG. 12A illustrates a cross-sectional view 1200 of some embodiments corresponding to Act 610 of FIG. 6.

Figure 12B:
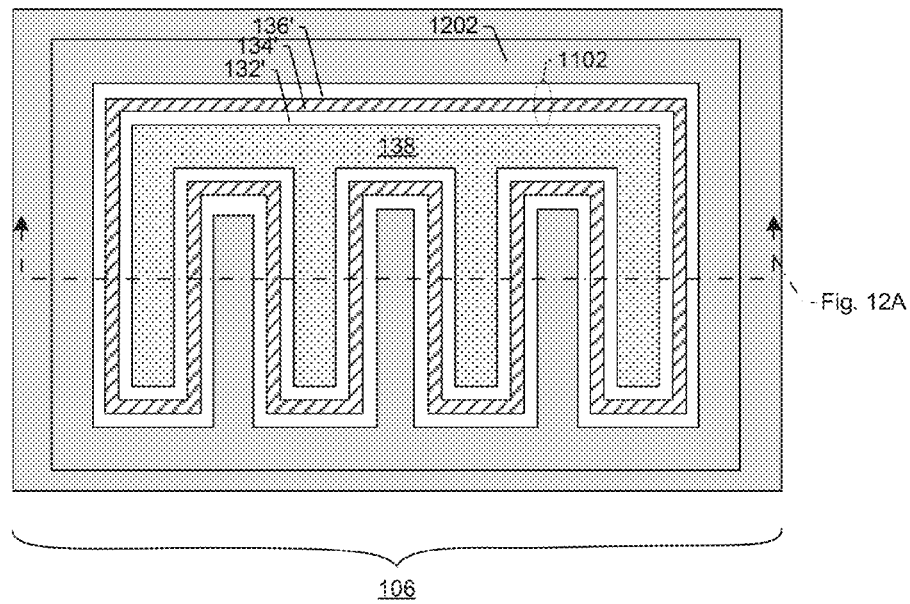

In FIG. 12A, a second doped polysilicon layer 1202 is formed over the second dielectric layer 1102. The second doped polysilicon layer 1202 is conformal over the second dielectric layer 1102, and thus is formed along sidewalls and over upper surfaces of the second dielectric layer 1102. As shown in FIG. 12B, which shows a top view of the capacitor region 106 in accordance with some embodiments of FIG. 12A, the second doped polysilicon layer 1202 laterally surrounds the first capacitor plate 138 and second dielectric layer 1102.

Figure 13A:
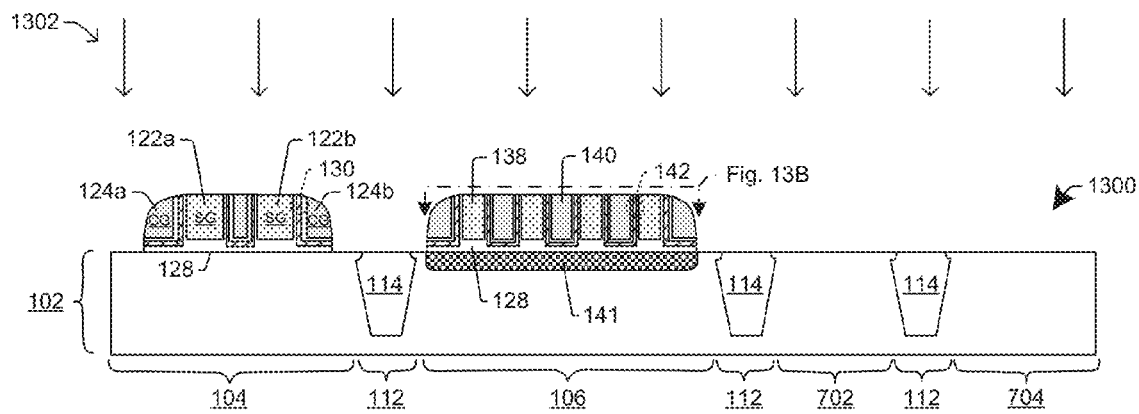
Figure 13B:
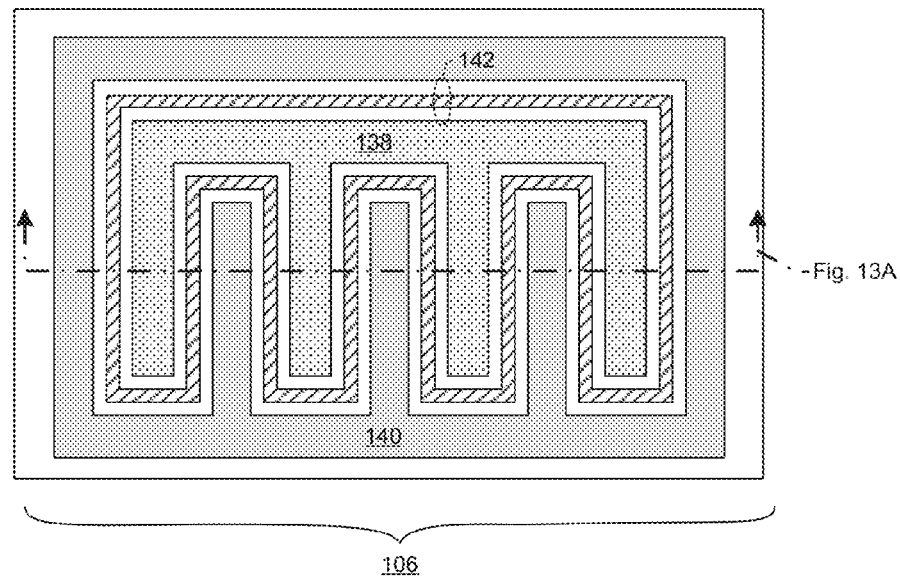

FIG. 13A illustrates a cross-sectional view 1300 of some embodiments corresponding to Act 612 of FIG. 6.

In FIG. 13A, an etch back process 1302, such as an anisotropic etch (e.g., vertical dry etch), is used to etch back the second doped polysilicon layer 1202 and the second dielectric layer 1102. After this etch back, the remaining second doped polysilicon layer establishes first and second control gates 124a, 124b over the flash memory region 104 and a second capacitor plate 140 over the capacitor region 106. As can be seen from the top view provided in FIG. 13B, after the etch, the first and second capacitor plates 138, 140 are inter-digitated with one another and separated from one another by a capacitor dielectric 142. In this way, the illustrated process provides for a streamlined capacitor which can have an increased capacitance relative to conventional approaches. Further, because the process forms the first and second capacitor plates 138, 140 concurrently with the select gates (122a, 122b) and control gates (124a, 124b), respectively, the manufacturing process is streamlined relative to conventional approaches.

Figure 14:
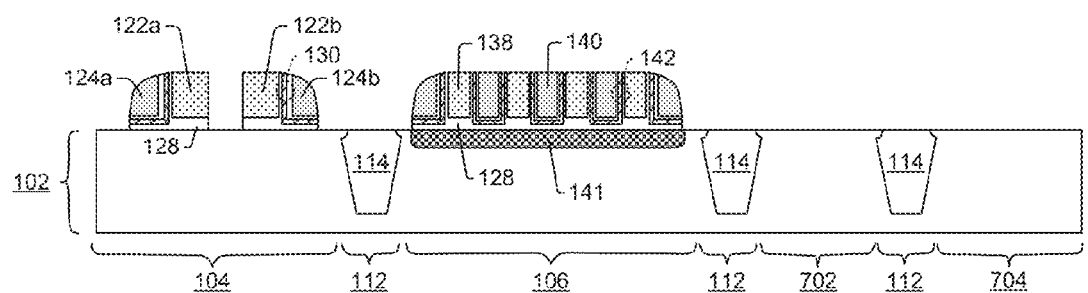

In FIG. 14, another mask (not shown) is formed that has an opening over a common source region between the first and second select gates 122a, 122b; and an etch is performed with this mask in place to expose this common source region. One or more ion implantation operations are then carried out to form individual source/drain regions 118a, 118b and common source drain region 120.

Figure 15:
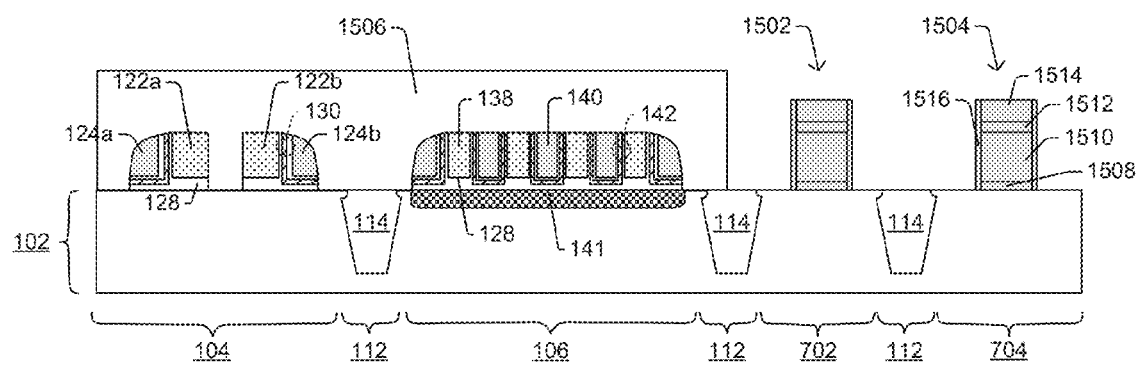

In FIG. 15, NMOS and PMOS logic gate structures 1502, 1504 are formed in the NMOS and PMOS logic regions 702, 704, respectively. To form these NMOS and PMOS logic gate structures, a protective mask 1506, such as photoresist and/or a hardmask, is formed over the flash region 104 and capacitor region 106, and a logic gate dielectric layer 1508, gate electrode layer 1510, hard mask layer 1512, and photomask layer 1514 are formed. An etch is carried out to form an NMOS gate structure and a PMOS gate structure, after which sidewalls spacers 1516 are formed.

Figure 16:
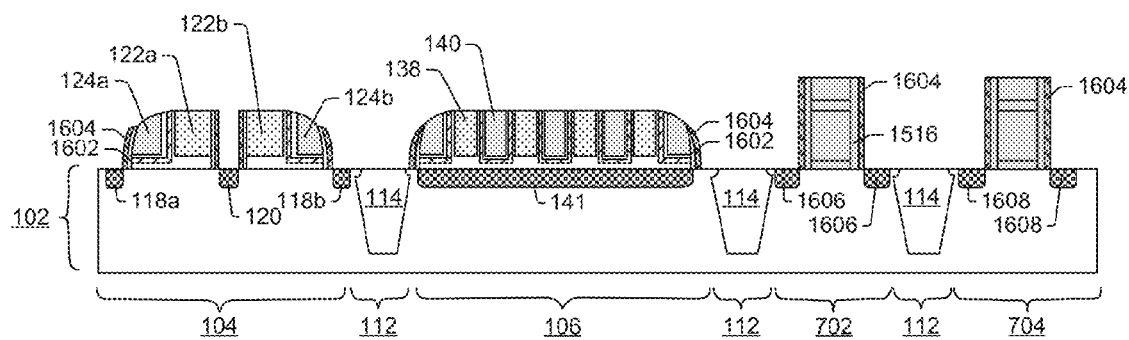

In FIG. 16, the protective mask 1506 is removed, and first sidewall spacers 1602 and are formed about sidewalls of the flash memory structure and about sidewalls of the capacitor structure. The first sidewall spacers 1602 can be formed by masking the NMOS and PMOS gate structures, forming a first conformal sidewall spacer layer over the flash memory structure and capacitor structure, and then etching back the first conformal sidewall spacer layer to establish the first sidewall spacers 1602. After the first sidewall spacers 1602 are formed, second sidewalls spacers 1604 can be formed about sidewalls of the flash memory structure, sidewalls of the capacitor structure, and sidewalls of the NMOS and PMOS gate structures. The second sidewall spacers 1604 can be formed by removing the mask covering the NMOS and PMOS gate structures, forming a second conformal sidewall spacer layer over the flash, capacitor, and NMOS and PMOS structures, and then etching back the second conformal sidewall spacer layer to establish the second sidewall spacers 1604. The first and second sidewall spacers 1602, 1604 can have different material compositions from one another, or can have the same material composition. After the second sidewall spacers 1604 are formed, an ion implantation operation can be carried out to implant flash individual source/drain regions 118a, 118b; flash common source/drain region 120; and NMOS and PMOS source/drain regions 1606, 1608.

Figure 17:
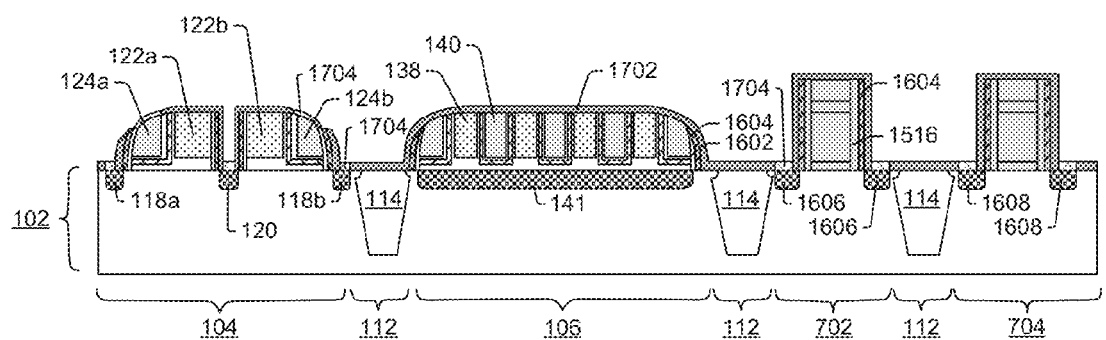

In FIG. 17, a protective layer 1702, such as a nitride material for example, is formed over the structure. The protective layer 1702 is selectively removed, for example by patterning a mask and carrying out an etch with the mask in place, to expose upper surfaces of source/drain regions and to expose upper or sidewall surfaces of the control gates 124a, 124b. With these regions exposed, a silicide layer 1704, such as a form nickel silicide, is then formed over the protective layer 1702.

Figure 18:
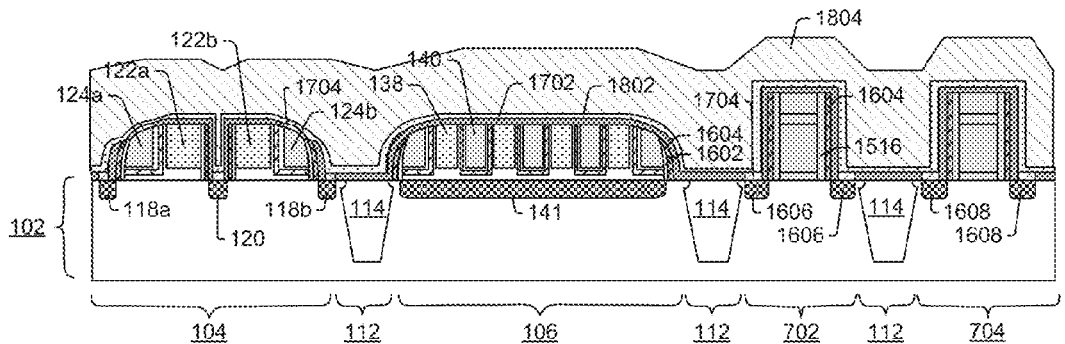

In FIG. 18, a contact etch stop layer (CESL) 1802 is then formed over the silicide layer 1704, and an inter-layer dielectric (ILD) 1804 is formed over the structure. The ILD 1804 can comprise silicon dioxide, which has a dielectric constant of 3.9, or a low-x dielectric, which has a dielectric constant of less than 3.9.

Figure 19:
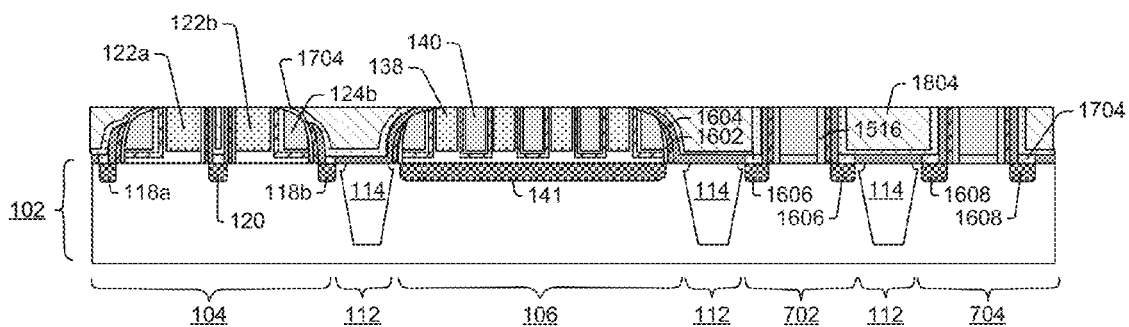

In FIG. 19, CMP has been carried out to planarize the upper surfaces of the logic gates, select gates, control gates, and first and second capacitor plates. Additional ILD layers and conductive interconnect layers can be formed over the structure to provide for electrical interconnection between the various devices.

It will be appreciated that identifiers such as "first" and "second" do not imply any type of ordering, placement, or temporal relationship with respect to other elements; but rather "first" and "second" and other similar identifiers are just generic identifiers and these elements can be swapped in other implementations. For example, "a first dielectric layer" described in connection with a first figure may not necessarily corresponding to a "first dielectric layer" described in connection with another figure or un-illustrated embodiment.

Some embodiments relate to an integrated circuit (IC). The IC includes a semiconductor substrate including a flash memory region and a capacitor region. A flash memory cell is arranged over the flash memory region, and a capacitor is arranged over the capacitor region. The flash memory region includes a polysilicon select gate arranged between first and second source/drain regions of the flash memory cell, and a control gate arranged alongside the select gate and separated from the select gate by a control gate dielectric layer. The capacitor includes a polysilicon first capacitor plate and polysilicon second capacitor plate, which are inter-digitated with one another and separated from one another by a capacitor dielectric layer. The capacitor dielectric layer and control gate dielectric layer are made of the same material.

Other embodiments relate to a method for manufacturing an embedded flash memory device. In the method, a semiconductor substrate, which includes a flash region and a capacitor region, is received. A first dielectric layer is formed over the flash and capacitor regions of the semiconductor substrate. A first doped polysilicon layer is formed over the first dielectric layer. Some portions of the first polysilicon layer and first dielectric layer are removed to establish a select gate over the flash region and a first capacitor plate over the capacitor region.

Still other embodiments relate to an integrated circuit (IC). The IC includes a semiconductor substrate, which includes a flash memory region and a capacitor region. A flash memory cell is arranged over the flash memory region, and a capacitor is arranged over the capacitor region. The flash memory cell includes a polysilicon select gate arranged between first and second source/drain regions of the flash memory cell, and a control gate arranged alongside the select gate and separated from the select gate by a control gate dielectric layer. The capacitor includes a polysilicon first capacitor plate, a capacitor dielectric layer that conformally and laterally surrounds the polysilicon first capacitor plate, and a polysilicon second capacitor plate that conformally and laterally surrounds the capacitor dielectric layer. At least one of the first and second capacitor plates includes one or more fingers that extend into one or more corresponding recesses in the other of the first and second capacitor plates such that the first and second capacitor plates are inter-digitated with one another and separated from one another by the capacitor dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
   a semiconductor substrate including a flash memory region and a capacitor region;
   a flash memory cell arranged over the flash memory region and including: a polysilicon select gate arranged between first and second source/drain regions of the flash memory cell, and a control gate arranged alongside the select gate and separated from the select gate by a control gate dielectric layer; and
   a capacitor arranged over the capacitor region and including: a polysilicon first capacitor plate and polysilicon second capacitor plate, which are inter-digitated with one another and have sidewalls separated from one another by a capacitor dielectric layer, wherein the capacitor dielectric layer and control gate dielectric layer are made of the same material; and
   wherein uppermost surfaces of the select gate and first capacitor plate are co-planar with one another.

2. The IC of claim 1, wherein the capacitor dielectric layer and control gate dielectric layer each comprise a charge trapping layer sandwiched between first and second dielectric layers.

3. The IC of claim 1, wherein the capacitor dielectric layer and control gate dielectric layer each comprise a tunnel dielectric layer, a capping dielectric layer, and a layer of silicon dots sandwiched between the tunnel dielectric layer and the capping dielectric layer.

4. The IC of claim 1, wherein the capacitor dielectric layer and control gate dielectric layer each comprise a tunnel oxide layer, a capping oxide layer, and a nitride layer sandwiched between the tunnel oxide layer and the capping dielectric layer.

5. The IC of claim 1, wherein the first capacitor plate has an upper surface and a thickness corresponding to those of the select gate; and wherein the second capacitor plate has an upper surface and thickness corresponding to those of the control gate.

6. The IC of claim 1, wherein upper outermost surfaces of the control gate and capacitor plate are rounded.

7. The IC of claim 1, wherein polysilicon material of the first capacitor plate is formed concurrently with polysilicon material of the select gate; and wherein polysilicon material of the second capacitor plate is formed concurrently with polysilicon material of the control gate.

8. The IC of claim 1, further comprising:
   a doped capacitor region arranged in the capacitor region of the semiconductor substrate;
   wherein the doped capacitor region is ohmically coupled to one of the first capacitor plate or the second capacitor plate such that the doped capacitor region and the one of the first capacitor plate or the second capacitor plate collectively act as a single capacitor plate.

9. The IC of claim 1, wherein the first capacitor plate includes a first plurality of fingers that extend outward from a first trunk which extends continuously between the first plurality of fingers.

10. The IC of claim 9, wherein the second capacitor plate includes a second plurality of fingers that extend outward from a second trunk which extends continuously between the second plurality of fingers, and wherein the first plurality of fingers are inter-digitated with the second plurality of fingers and are separated there from by the capacitor dielectric layer.

11. A method for manufacturing an embedded flash memory device, the method comprising:

receiving a semiconductor substrate, which includes a flash region and a capacitor region;

forming a first dielectric layer over the flash and capacitor regions of the semiconductor substrate, and forming a first doped polysilicon layer over the first dielectric layer; and removing some portions of the first polysilicon layer and first dielectric layer to establish a select gate over the flash region and a first capacitor plate over the capacitor region, wherein uppermost surfaces of the select gate and the first capacitor plate are co-planar with one another.

12. The method of claim 11, further comprising:

forming a second dielectric layer which is conformal along sidewalls and upper surfaces of the select gate and the first capacitor plate;

forming a second doped polysilicon layer which is conformal along sidewalls and upper surfaces of the second dielectric layer; and removing some portions of the second polysilicon layer and second dielectric layer to concurrently establish a control gate alongside the select gate and a second capacitor plate alongside the first capacitor plate.

13. The method of claim 12, wherein the first capacitor plate includes a first plurality of fingers that extend outward from a first trunk which extends continuously between the first plurality of fingers.

14. The method of claim 13, wherein the second capacitor plate includes a second plurality of fingers that extend outward from a second trunk which extends continuously between the second plurality of fingers.

15. The method of claim 14, wherein the first plurality of fingers are inter-digitated with the second plurality of fingers and the second dielectric layer resides between neighboring sidewalls of the first and second plurality of fingers to separate the first and second plurality of fingers from one another.

16. An integrated circuit (IC), comprising:

a semiconductor substrate including a flash memory region and a capacitor region;

a flash memory cell arranged over the flash memory region and including: a polysilicon select gate arranged between first and second source/drain regions of the flash memory cell, and a control gate arranged alongside the select gate and separated from the select gate by a control gate dielectric layer; and a capacitor arranged over the capacitor region and including: a polysilicon first capacitor plate, a capacitor dielectric layer that conformally and laterally surrounds the polysilicon first capacitor plate, and a polysilicon second capacitor plate that conformally and laterally surrounds the capacitor dielectric layer, wherein at least one of the first and second capacitor plates includes one or more fingers that extend into one or more corresponding sidewall recesses in the other of the first and second capacitor plates such that the first and second capacitor plates are inter-digitated with one another and separated from one another by the capacitor dielectric layer; and wherein uppermost surfaces of the select gate and first capacitor plate are co-planar with one another.

17. The IC of claim 16, wherein the capacitor dielectric layer and control gate dielectric layer are made of the same material.

18. The IC of claim 16, wherein the capacitor dielectric layer and control gate dielectric layer each comprise a tunnel dielectric layer, a capping dielectric layer, and a layer of silicon dots sandwiched between the tunnel dielectric layer and the capping dielectric layer.

19. The IC of claim 16, wherein the capacitor dielectric layer and control gate dielectric layer each comprise a tunnel oxide layer, a capping oxide layer, and a nitride layer sandwiched between the tunnel oxide layer and the capping dielectric layer.

20. The IC of claim 16, wherein the first capacitor plate has an upper surface and a thickness corresponding to those of the select gate; and wherein the second capacitor plate has an upper surface and thickness corresponding to those of the control gate.

* * * * *